United States Patent
Gordon et al.

(10) Patent No.: US 10,948,511 B2
(45) Date of Patent: Mar. 16, 2021

(54) APPARATUS AND METHOD FOR VERIFYING OPERATION OF AIR DATA PROBES

(71) Applicant: Honeywell International Inc., Morris Plains, NJ (US)

(72) Inventors: Grant Gordon, Peoria, AZ (US); Raviprakash Thotadakumbri, Bagalore (IN); Eugene G. Landree, Phoenix, AZ (US); Merle L. Sand, Scottsdale, AZ (US)

(73) Assignee: Honeywell International Inc., Charlotte, NC (US)

( * ) Notice: Subject to any disclaimer, the term of this patent is extended or adjusted under 35 U.S.C. 154(b) by 482 days.

(21) Appl. No.: 15/912,497

(22) Filed: Mar. 5, 2018

(65) Prior Publication Data

US 2019/0271715 A1 Sep. 5, 2019

(51) Int. Cl.
*G01P 5/14* (2006.01)
*G01R 19/00* (2006.01)
(Continued)

(52) U.S. Cl.
CPC .............. *G01P 5/14* (2013.01); *G01P 21/025* (2013.01); *G01R 19/0038* (2013.01);
(Continued)

(58) Field of Classification Search
CPC ..... G01P 5/14; G01P 21/025; G01R 19/0038; G01R 19/0053; G01R 31/2829; G01R 31/2836; G01L 27/007
(Continued)

(56) References Cited

U.S. PATENT DOCUMENTS 5,627,311 A * 5/1997 Nakaya .................. G01M 9/06
                                                              73/147
8,718,955 B2   5/2014 Golly et al.
(Continued)

FOREIGN PATENT DOCUMENTS

CN     102323005 A     1/2012
GB      2478522 B     10/2013
(Continued)

OTHER PUBLICATIONS

European Patent Office, "Extended European Search Report from EP Application No. 19160664.9 dated Jul. 19, 2019", from Foreign Counterpart to U.S. Appl. No. 15/912,497, pp. 1-12, Published: EP.
(Continued)

*Primary Examiner* — Marrit Eyassu
(74) *Attorney, Agent, or Firm* — Fogg & Powers LLC (57) ABSTRACT

A method, comprises: receiving measured air pressure data from each air data probe on a vehicle; receiving a first set of data from at least one sensor system on the vehicle; determining predicted noise levels for each air data probe using a noise modelling system and the received first set of data; determining a transmission loss for each air data probe; determining if any air data probe is faulty by determining if an transmission loss of any of the air data probes is greater than a first threshold value, where an air data probe is deemed faulty if its transmission loss is greater than the first threshold value; and if the transmission loss of any of the air data probes is greater than the first threshold value, then generating a signal to indicated that at least one air data probe is faulty.

21 Claims, 5 Drawing Sheets

(51) Int. Cl.
*G01R 31/28* (2006.01)
*G01P 21/02* (2006.01)

(52) U.S. Cl.
CPC ..... *G01R 19/0053* (2013.01); *G01R 31/2829* (2013.01); *G01R 31/2836* (2013.01)

(58) Field of Classification Search
USPC .......................................................... 73/1.57
See application file for complete search history.

(56) References Cited

U.S. PATENT DOCUMENTS

| | | | |
|---|---|---|---|
| 8,924,184 B2 | 12/2014 | Hashemian et al. | |
| 9,021,856 B2 | 5/2015 | LeBlond et al. | |
| 9,694,902 B2 | 7/2017 | Guillet et al. | |
| 10,043,402 B1* | 8/2018 | Alvarez | G01P 5/16 |
| 2007/0150122 A1* | 6/2007 | Hongerholt | G01P 13/025 |
| | | | 701/3 |
| 2009/0112498 A1* | 4/2009 | Krone | G01R 31/2829 |
| | | | 702/69 |
| 2012/0299753 A1* | 11/2012 | Thoreen | G01C 23/005 |
| | | | 340/975 |
| 2014/0156226 A1* | 6/2014 | Hashemian | G01P 21/025 |
| | | | 702/185 |
| 2015/0148997 A1 | 5/2015 | Brot et al. | |

FOREIGN PATENT DOCUMENTS

| | | |
|---|---|---|
| WO | 2011003963 A2 | 1/2011 |
| WO | 2016135061 A1 | 9/2016 |

OTHER PUBLICATIONS

Glenn Research Center, "Technical Support Package, Integrated Pitot Health Monitoring System", "NASA Tech Briefs, LEW-19153-1", pp. 1-4, Published in: Cleveland, Ohio.

Rodrigues et al, "Acoustic Reflectometry for Pitot Tube Blockage Detection", "Conference Paper for AIAA Aviation Forum Jun. 5-9, 2017, Denver, Colorado", "23rd AIAA/CEAS Aeroacoustics Conference", Uploaded on Jan. 21, 2018, pp. 1-22, Publisher: American Institute of Aeronautics and Astronautics, Inc., with permission.

European Patent Office, "Communication pursuant to Article 94(3) EPC from EP Application No. 19160664.9"from Foreign Counterpart to U.S. Appl. No. 15/912,497, dated Mar. 2, 2020, pp. 1-5, Published: EP.

European Patent Office, "Communication under Rule 71(3) EPC from EP Application No. 19160664.9", from Foreign Counterpart to U.S. Appl. No. 15/912,497, dated Oct. 29, 2020, pp. 1 through 32, Published: EP.

* cited by examiner

APPARATUS AND METHOD FOR VERIFYING OPERATION OF AIR DATA PROBES

BACKGROUND

Air data probes, such as pitot probes (which measure total pressure, or the sum of dynamic and static pressure) and/or pitot static tubes (which measure static and total pressures), are used to measure an aircraft's altitude and speed. Air data probes are susceptible to blockages which give rise to erroneous measurements. Blockages can arise due to icing, failure to remove covers from probes, and insect infestation. Erroneous measurements from air data probes have led to aircraft crashes. Therefore, there is a need to verify proper operation of air data probes during aircraft operation.

SUMMARY

A method is provided. The method comprises: receiving measured air pressure data from each air data probe on a vehicle; receiving a first set of data from at least one sensor system on the vehicle; determining predicted noise levels for each air data probe using a noise modelling system and the received first set of data; determining a transmission loss for each air data probe; determining if any air data probe is faulty by determining if an transmission loss of any of the air data probes is greater than a first threshold value, where an air data probe is deemed faulty if its transmission loss is greater than the first threshold value; and if the transmission loss of any of the air data probes is greater than the first threshold value, then performing at least one of: (a) generation of a signal to alert at least one vehicle system that at least one air data probe is faulty, (b) generation of a signal to alert a crew of the vehicle that at least one air data probe is faulty, and (c) determination of a weighted average air pressure for all air data probes, where the air pressures of any faulty air data probe has a lower weighting than air pressures of any non-faulty air data probes.

DRAWINGS

Understanding that the drawings depict only exemplary embodiments and are not therefore to be considered limiting in scope, the exemplary embodiments will be described with additional specificity and detail through the use of the accompanying drawings, in which.

In accordance with common practice, the various described features are not drawn to scale but are drawn to emphasize specific features relevant to the exemplary embodiments. Reference characters denote like elements throughout figures and text.

DETAILED DESCRIPTION

In the following detailed description, reference is made to the accompanying drawings that form a part hereof, and in which is shown by way of illustration specific illustrative embodiments. However, it is to be understood that other embodiments may be utilized and that structural, mechanical, and electrical changes may be made. Furthermore, the method presented in the drawing figures and the specification is not to be construed as limiting the order in which the individual steps may be performed. The following detailed description is, therefore, not to be taken in a limiting sense.

Broadband noise (noise) from a vehicle's propulsion system is detected by, e.g. pressure sensor(s) of, one or more air data probes (air data probe(s)). The noise is propagated as pressure waves which can be detected by pressure sensors.

The term noise may also be used herein. The terms noise and sound are interchangeable as used herein.

An air data probe is a type of pressure sensor system. The invention is applicable to pressure sensor systems in any application, e.g. such as industrial applications. However, for pedagogical purposes, the invention is illustrated for use with air data probe(s) used in vehicles.

A model of noise level over frequency detected by each air data probe is generated based upon parameters of the vehicle's propulsion system, control systems, state vector, and/or environment. In one embodiment, the model is continually modified to account for variations in vehicle performance over time, e.g. due to the aging of vehicle components and the resulting change to noise level over frequency detected by the air data probe(s).

During vehicle operation, noise measurements amongst air data probes, and/or the difference between the modelled and measured noise levels at each air data probes, are characterized. Discrepancies between modeled and measured noise (and optionally other factors) are used to alert vehicle system(s) and/or crew that the air data probes are possibly malfunctioning.

Figure 1:
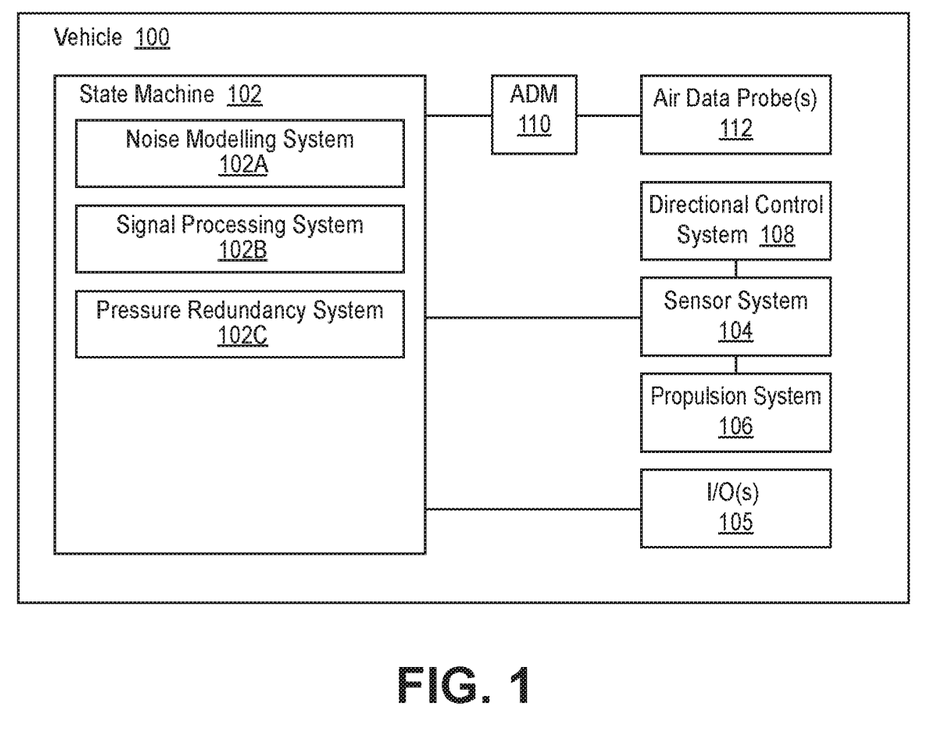
FIG. 1 illustrates a block diagram of an exemplary vehicle including a system to validate proper air data probe operation.

FIG. 1 illustrates a block diagram of an exemplary vehicle (vehicle) 100 including a system to validate proper air data probe operation. The vehicle 100 may be an aircraft, a helicopter, a spacecraft, or any other type of vehicle that utilizes air data probe(s) (air data probes(s)) 112. The two or more air data probes 112 may be co-located or located at different locations about the exterior of the vehicle 100.

The vehicle 100 comprises a state machine (state machine) 102 coupled to an air data monitoring system (ADM) 110. The ADM 110 is coupled to the air data probe(s) 112 such as pitot tube(s) and/or pitot static tube(s). The air data probe(s) measure parameter(s) representative of environmental characteristic(s), e.g. air pressure. Optionally, the air data probe(s) 112 also measure parameter(s) representative of characteristics about performance of the vehicle 100, such as angle of attack, side slip, and altitude. At least one pressure sensor is located in each air data probe 112 and/or the ADM 110. In one embodiment, pneumatic tubing couples each air data probe 112 to the ADM 110, and at least one pressure sensor for each air data probe 112 is housed in the ADM 110 and is coupled to a pneumatic tube coupled to the corresponding air data probe 112. The pressure sensor in an air data probe measures pressure in that probe. Such pressure measurements are at or near DC or zero hertz. The pressure sensor can also detect noise at higher frequencies generated from the propulsion system (propulsion system) 106 of the vehicle 100.

The ADM 110 processes such parameter(s) to generate data about the environment and/or performance of the vehicle 100 which is coupled to other systems of the vehicle and/or reported to crew of the vehicle 100. In one embodiment, the ADM 110 includes at least one analog to digital converters (data converter(s)), such as a sigma delta converter. In one embodiment, a unique data converter is coupled to a unique air data probe, e.g. a unique pressure sensor. In another embodiment, a single data converter is used, and is successively coupled to different air data probes by a multiplexor. In a further embodiment, the data converter(s) have a relatively short acquisition period, e.g. five microseconds, and a relatively high sampling rate, e.g. 200 kHz.

The vehicle 100 also includes at least one input/output device (I/O(s)) 105 which may be for example a display or an audio alert system (e.g. a speaker, and a voice synthesizer or audio oscillator). The I/O(s) 105 are coupled to the state machine 102.

The state machine 102 is also coupled to at least one sensor system (sensor system) 104. The sensor system 104 is coupled to a propulsion system 106, to at least one directional control system (directional control system(s)) 108, environmental sensor(s), and/or one or more location and movement sensor(s). The propulsion system 106 includes one or more systems used to control the speed of the vehicle 100, e.g. jet engine(s), propeller engine(s), and/or rocket(s) which may be coupled to throttle system(s) to control the amount of propulsive force. The directional control system(s) 108 includes one or more systems to control the direction of travel of the vehicle 100, e.g. position(s) of aileron(s), position(s) of rudder(s), and/or wheels. The sensor system 104 may include environmental sensors such as external temperature sensor(s). The sensor system 104 may also include state vector sensor(s) such as barometric altimeter(s), compass(es), inertial navigation management unit(s), and/or global satellite navigation system receiver(s) (e.g. GPS receiver(s)); the state vector sensor's provide information about the state vector of the vehicle 100 such as direction, location, and speed.

In the illustrated embodiment, the state machine 102 comprises a noise modelling system (noise modelling system) 102A, a signal processing system (signal processing system) 102B, and a pressure redundancy system (pressure redundancy system) 102C. Although, the state machine 102 can be implemented with the foregoing components in which each perform functions subsequently described, the state machine 102 can be alternatively implemented by one or more components that, e.g. perform the same functionality. Therefore, the foregoing components are exemplary and provided for illustrative purposes.

The illustrated noise modeling system 102A estimates noise levels, e.g. in decibels, that would be measured by each of the air data probe(s) 112 based upon values of parameters provided by the sensor system 104. Such parameters may include throttle level(s), fan rotational speed (N1), core rotational speed (N2), turbine inlet temperature, fuel flow, bleed air pressure, weight on wheels, flap angle, and/or thrust reversal status(es). Alternatively, the noise modelling system 102A estimates one noise levels representative of the noise levels measured by each of the air data probe(s) 112.

Figure 2:
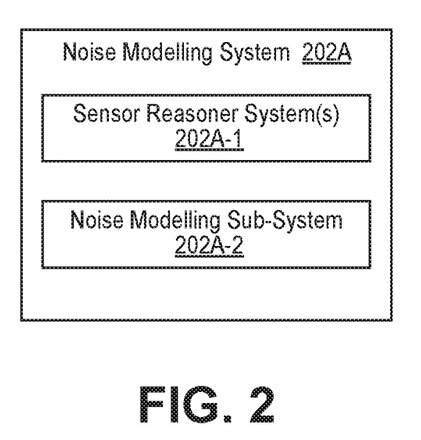
FIG. 2 illustrates a block diagram of an exemplary noise modeling system.

FIG. 2 illustrates a block diagram of an exemplary noise modeling system (noise modeling system) 202A. The illustrated noise modeling system 202A includes at least one sensor reasoner system (sensor reasoner system(s)) 202A-1 and a noise modeling sub-system (noise modelling sub-system) 202A-2. The noise modelling sub-system 202A-2 includes a noise model that estimates noise levels measured by each air data probe. In one embodiment, the noise model is one or more multi-variable polynomials each of whose coefficients are determined by regression analysis, e.g. by the sensor reasoner system(s) 202A-1, using data received from the sensor system 104. A single noise model may be determined for all air data probes, or a noise model may be determined for each air data probe.

The noise model can vary from vehicle type to vehicle type, and from vehicle to vehicle of the same vehicle type. The noise model is dependent upon the design of the air data probe(s) 112 (e.g. tube dimensions), the type and characteristics of a propulsion system 106 and the type of sensor systems 104 of a given vehicle. The noise model and initial coefficients may be determined by modelling the operation of the vehicle 100 and/or using measured data, e.g. engine noise at the air data probe(s) and propulsion system, control system, state vector, and/or environment parameter data provided by the sensor system 104. In one embodiment, the sensor system 104 is configured to measure and/or provide such propulsion system, control system, state vector, and/or environment parameter data.

The noise modelling sub-system 202A-2 is configured to: receive the data from the sensor system 104 about parameters of the vehicle's propulsion system 106, directional control system(s) 108, state vector, and/or environment; and using such data, generates one or more estimates of noise levels. The sensor reasoner system(s) 202A-1 perform the aforementioned regression analysis, e.g. using least means squares analysis. Optionally, the sensor reasoner system(s) 202A-1 are configured to modify, over time and the operation of the vehicle 100, the coefficients used by noise modelling sub-system 202A-2 using newly measured noise data and corresponding propulsion system, control system, state vector, and/or environment parameter data provided by the sensor system 104. Also, optionally, one or more of the reasoner system described herein are implemented with machine learning and/or fuzzy logic; for example the sensor reasoner system(s) 202A-1 may use machine learning and/or fuzzy logic to modify the coefficients and/or corresponding form of the noise equation.

The signal processing system 102B provides digital signal processing functionality. The signal processing system 102B is configured to calculate the difference between the predicted noise levels of and the measured noise at each air data probe. Any difference, or any significant difference, is a transmission loss due a blockage in, or other failure of, of an air data probe.

Figure 3:
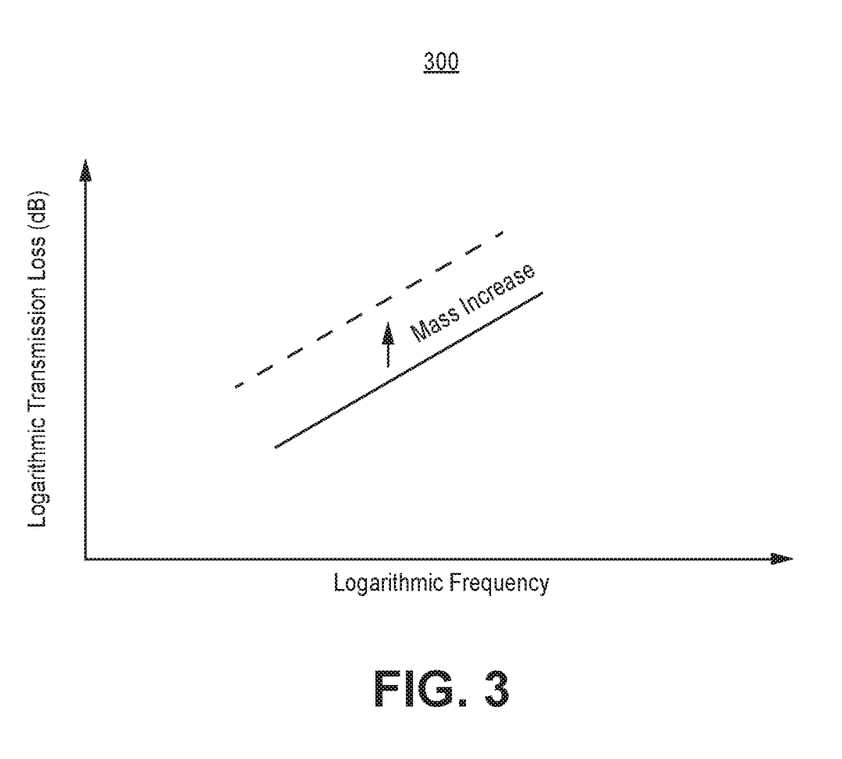
FIG. 3 illustrates an exemplary a chart of logarithmic transmission loss (decibels) versus logarithmic frequency.

FIG. 3 illustrates an exemplary a chart of logarithmic transmission loss (decibels) versus logarithmic frequency 300. To first order, on such a logarithmic plot, the transmission loss for the noise signal increases monotonically with frequency. The transmission loss has a substantially linear region as a function of frequency, a slope, e.g. of 6 dB per octave. The substantially linear region is also referred to as the mass controlled region bandwidth. If a mass is inserted in or at the opening of the air data probe, to a first order the transmission loss will increase. In another embodiment, the signal processing system 102B is configured to identify, for one or more air data probe(s) 112, the mass controlled region bandwidth using measured data, e.g. by using linear regression. Optionally, the signal processing system 102B then determines the difference(s) between the measured and predicted noise levels (residual noise) (i.e. transmission loss(es)) in the frequency range of the mass controlled region bandwidth. Predicted noise levels are determined by applying measured data provided by the sensor system 104 (as discussed above) to independent variables of the noise model, e.g. of the noise model sub-system 202A. If, e.g. the pressure redundancy reasoner system (pressure redundancy reasoner system) 402C-1 determines that, the transmission loss in the mass controlled region bandwidth for an air data probe is greater than a first threshold value, then that air data probe is denoted as possibly being inaccurate.

The first threshold value may be defined by the user or designer of the state machine 102. A user defined first threshold value may be a fixed value. A system defined first threshold value may be a fixed value, or a value dependent upon an average of the transmission losses of some or all air data probes The mass controlled region bandwidth may be a broad bandwidth, Optionally, the signal processing system 102B is configured to filter measured noise, e.g. with a high pass filter to eliminate spurious low frequency content and/or with a notch filter to diminish narrow band noise peak(s) corresponding to the revolution rate of propulsion system 106.

The state machine 102, e.g. the signal processing system 102B, is configured to determine one or more of the following:
- (a) the difference between measured and predicted noise levels (transmission loss) for one or more, e.g. each, air data probe at one or more discrete frequencies (frequenc(ies)), and/or over one or more frequency band(s) (band(s)). Noise level measurements, as used herein, are sound pressure level measurements. Optionally, the band(s) are in the mass controlled region bandwidth. The analysis is performed at frequency increments in the band(s), e.g. fractional-octave analysis (i.e. over band(s) having a bandwidth of less than one octave). The analysis can be performed by comparing noise level measurements, power spectral densities at given frequencies, or through fractional-octave analysis;
- (b) the difference in transmission loss of an air data probe at any two frequencies or over band(s). Optionally, the band(s) are in the mass controlled region bandwidth. The analysis can be performed by comparing noise level measurements, power spectral densities at given frequencies, or through fractional-octave analysis;
- (c) the difference in measured noise of an air data probe at any two frequencies or over bands. Optionally, the band(s) are in the mass controlled region bandwidth. The analysis is performed at frequency increments in the band(s), e.g. fractional-octave analysis. The analysis can be performed by comparing noise level measurements, power spectral densities at given frequencies, or through fractional-octave analysis; and
- (d) the difference in measured noise of two or more air data probes at a frequency or band. Optionally, the band is in the bandwidth that is in the mass controlled region bandwidth. The analysis can be performed by comparing noise level measurements, power spectral densities at given frequencies, or through fractional-octave analysis.

Machine learning and/or fuzzy logic may be used to incorporate items a-d into the analysis. Also, optionally, the units for one or more of the aforementioned determined parameters and/or any measured noise levels are in decibel units.

Figure 4:
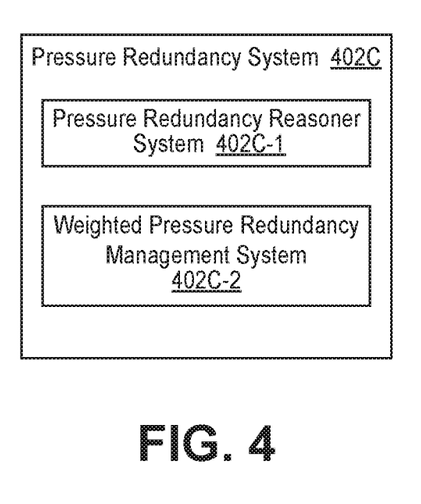
FIG. 4 illustrates a block diagram of one embodiment of a pressure redundancy system.

FIG. 4 illustrates a block diagram of one embodiment of a pressure redundancy system (pressure redundancy system) 402C. The pressure redundancy system 402C comprises a pressure redundancy reasoner system 402C-1 and a weighted pressure redundancy management system (weighted pressure redundancy management system) 402C-2. In one embodiment, the pressure redundancy reasoner system 402C-1 determines whether the transmission loss of any air data probe exceeds a first threshold value. Optionally, the transmission loss of any air data probe may be an average transmission loss of any air data probe. If the first threshold is exceeded by the transmission loss for any air data probe, then the pressure redundancy reasoner system 402C-1 deems the corresponding air data probe to be faulty. Optionally, the pressure redundancy reasoner system 402C-1 also uses the following aforementioned and determined parameters to determine if the corresponding air data probe is potentially faulty: the difference of transmission losses between any two air data probes, the difference in transmission loss of an air data probe at any two frequencies or over band(s), the difference in measured noise of any two air data probes, and/or the difference in measured noise of an air data probe at any two frequencies or over bands.

Optionally in one embodiment, the pressure redundancy reasoner system 402C-1 generates signal(s) to alert vehicle system(s) or to alert the crew of the vehicle 100 of faulty air data probe(s). For example, the pressure redundancy reasoner system 402C-1 may generate signals that cause a visual and/or audio alert provided to the crew of the vehicle 100 by the I/O(s).

Optionally in one embodiment, the weighted pressure redundancy management system 402C-2 determines at least one weighted pressure measurement of all air data probes. If one or more air data probes are determined by the pressure redundancy reasoner system 402C-1 not to be faulty, the corresponding pressure measurement(s) of such non-faulty air data probe(s) are each assigned a weighting, e.g. a fixed value, or a variable that is dependent upon the number of faulty air data probe(s) and/or the transmission loss of a corresponding air data probe. In one embodiment, if the pressure redundancy reasoner system 402C-1 determines one or more of the air data probes are faulty, the corresponding pressure measurement(s) of such faulty air data probe(s) are each assigned a weighting that is less than the weighting assigned to each non-faulty air data probe. Optionally, the weighting assigned to pressure measurements of faulty air data probe(s) is a fixed value less than the value(s) assigned to non-faulty air data probe(s)s, or a variable that is dependent upon the number of faulty air data probe(s) and/or the transmission loss of a corresponding air data probe.

In one embodiment, the weighting assigned to pressure measurements of air data probe(s) deemed faulty is zero. This technique eliminates the pressure measurements of deemed faulty air data probe(s) from the determination of the weighted pressure measurement(s). This technique is analogous to a voting scheme that removes bad measurements.

In one embodiment, the weighted pressure redundancy management system 402C-2 determines the weighted pressure measurement of all air data probes by:
- (i) determining the weightings, and optionally scaling each weighting so that the sum of the weightings equals one.
- (ii) multiplying the weightings corresponding to each non-faulty air data probe by the air pressure measured by the corresponding non-faulty air data probe;
- (iii) multiplying the weightings corresponding to each faulty air data probe by the air pressure measured by the corresponding faulty air data probe. and
- (iv) summing the weighted air pressures measured by faulty and non-faulty air data probes.

However, the calculation of weighted pressure measurement may be performed in different ways.

Figure 5:
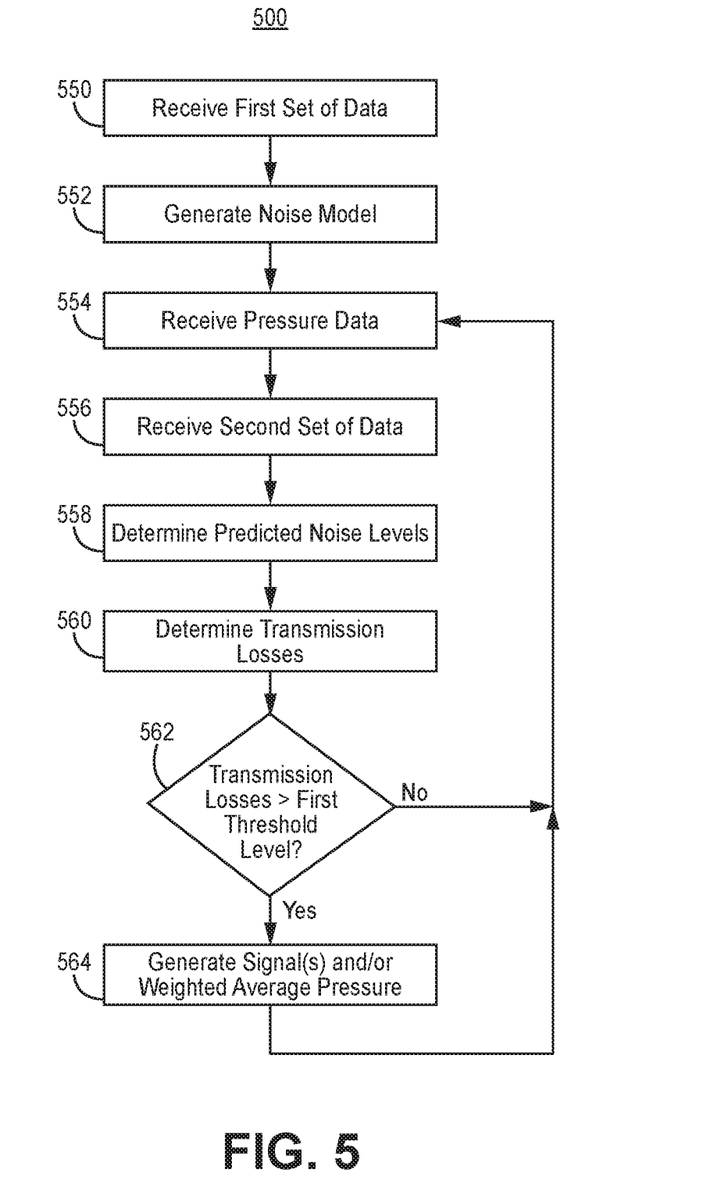
FIG. 5 illustrates an exemplary flow diagram of a method to verify air data probe measurements.

FIG. 5 illustrates an exemplary flow diagram of a method to verify air data probe measurements (air data probe measurements) 500. To the extent the method 500 shown in FIG. 5 is described herein as being implemented in the system shown in FIGS. 1-4, it is to be understood that other embodiments can be implemented in other ways. The blocks of the flow diagrams have been arranged in a generally sequential manner for ease of explanation; however, it is to be understood that this arrangement is merely exemplary, and it should be recognized that the processing associated with the methods (and the blocks shown in the Figures) can occur in a different order (for example, where at least some of the processing associated with the blocks is performed in parallel and/or in an event-driven manner).

Optionally, determine the noise model(s) of air data probes on a vehicle. Optionally, in block 550, receive a first set of data from the sensor system on the vehicle, e.g. such as described above. Optionally, in block 552, generate at least one noise model using the received first set of data, e.g. as described above and using the sensor reasoner system(s) 202A-1. Optionally, in block 552, determine the mass controlled region bandwidth using the first set of data prior to generating the at least one noise model, e.g. with the signal processing system 102B.

During vehicle operation, verify operation of the air data probes and/or determine a weighted average air pressure. In block 554, receive measured pressure from each air data probe on the vehicle. Optionally, filter the measured pressure data, e.g. with a high pass filter and/or a notch filter at the revolution frequency of the propulsion system, prior to determining transmission loss.

In block 556, receive a second set of data from the sensor system on the vehicle. In block 558, determine predicted noise levels for each air data probe using the received second set of data, e.g. using the noise modelling sub-system 202A-2. In one embodiment, use the second set of data to modify the at least one noise model. Optionally, in block 558, determine the mass controlled region bandwidth using the second set of data before determining the predicted noise levels, e.g. with the signal processing system 102B.

In block 560, determine an transmission loss for each air data probe, e.g. with the pressure redundancy reasoner system 402C-1. In block 562, e.g. with the pressure redundancy reasoner system 402C-1, determine if an absolute value of an transmission loss of any of the air data probes is greater than a first threshold value, where an air data probe is deemed faulty if its corresponding transmission loss is greater than the first threshold value. Optionally, determine whether any air data probe is faulty is based upon analyzing one or more of the following data in addition to the foregoing (which are further described above):

(a) the transmission loss for one or more air data probes at one or more frequencies and/or over one or more band(s);
 (b) the difference in transmission loss of an air data probe at any two frequencies or over band(s);
 (c) the difference in measured noise of an air data probe at any two frequencies or over bands; and
 (d) the difference in measured noise of two or more air data probes at a frequency or band.

In block 564, if the transmission loss of any of the air data probes is greater than the first threshold value, then perform at least one of: (a) generating a signal to alert at least one vehicle system that at least one air data probe is faulty, (b) generating a signal to alert a crew of the vehicle that at least one air data probe is faulty, and (c) determining a weighted average air pressure for all air data probes, where the air pressures of any faulty air data probe has a lower weighting than air pressures of any non-faulty air data probes. Optionally, the weightings assigned to faulty and non-faulty air data probes are as described above. After block 564, return to block 554. If the transmission losses of all air data probes are equal to or less than the first threshold value, then return to block 554.

The state machine 102 used in the present system and method can be implemented using software executed on hardware as known to one of skill in the art. For example, the hardware may be a computer comprising one or more microprocessor and/or Digital Signal Processing (DSP) circuits coupled to memory circuits (e.g. described below). The microprocessor and/or DSP circuits may be supplemented by, or incorporated in, specially-designed Application Specific Integrated Circuits (ASICs) or Field Programmable Gate Arrays (FPGAs). The computer, e.g. the processing circuits, are configured to execute computer readable instructions for carrying out various process tasks, calculations, and control functions used in the present method and system.

The present method can be implemented by computer executable instructions, such as program modules or components, which are executed by processing circuit(s). Generally, program modules include routines, programs, objects, data components, data structures, algorithms, and the like, which perform particular tasks or implement particular data types.

Instructions for carrying out the various process tasks, calculations, and generation of other data used in the operation of the methods described herein can be implemented in software, firmware, or other computer-readable or processor-readable instructions. These instructions are typically stored on any appropriate computer program product that includes a computer readable medium used for storage of computer readable instructions or data structures. Such a computer readable medium can be any available media, e.g. illustrated herein, that can be accessed by a general purpose or special purpose computer or processor, or any other device.

Suitable computer readable media may include storage or memory media such as magnetic or optical media. For example, storage or memory media may include magnetic media (such as conventional hard disks), optical media (such as CDs, DVDs, and Blu-ray discs, and semiconductor memory (such as Random Access Memory (RAM) (including, but not limited to, Dynamic Random Access Memory (DRAM), Synchronous Dynamic Random Access Memory (SDRAM), Double Data Rate (DDR) RAM, RAMBUS Dynamic RAM (RDRAM), and Static RAM (SRAM)), Read Only Memory (ROM), Electrically Erasable Programmable ROM (EEPROM), and Flash memory). Combinations of the above are also included within the scope of computer readable media.

Example Embodiments

Example 1 includes a method, comprising: receiving measured air pressure data from each air data probe on a vehicle; receiving a first set of data from at least one sensor system on the vehicle; determining predicted noise levels for each air data probe using a noise modelling system and the received first set of data; determining a transmission loss for each air data probe; determining if any air data probe is faulty by determining if an transmission loss of any of the air data probes is greater than a first threshold value, where an air data probe is deemed faulty if its transmission loss is greater than the first threshold value; and if the transmission loss of any of the air data probes is greater than the first threshold value, then performing at least one of: (a) generation of a signal to alert at least one vehicle system that at least one air data probe is faulty, (b) generation of a signal to alert a crew of the vehicle that at least one air data probe is faulty, and (c) determination of a weighted average air pressure for all air data probes, where the air pressures of any faulty air data probe has a lower weighting than air pressures of any non-faulty air data probes.

Example 2 includes the method of Example 1, where the determining the transmission loss for each air data probe comprises determining the transmission loss for each air data probe by at least one of: comparing noise level measurements, power spectral densities at given frequencies, and through fractional-octave analysis.

Example 3 includes the method of any of Examples 1-2, further comprising receiving a second set of data from the at least one sensor system on the vehicle; and generating at least one noise model using the received second set of data.

Example 4 includes the method of any of Examples 1-3, further comprising using the first set of data to modify the at least one noise model.

Example 5 includes the method of any of Examples 1-4, wherein determining whether any air data probe is faulty further comprises analyzing at least one of: a. the transmission loss for one or more air data probes at one or more frequencies and/or over one or more band(s); b. the difference in transmission loss of an air data probe at any two frequencies or over band(s); c. the difference in measured noise of an air data probe at any two frequencies or over bands; and d. the difference in measured noise of two or more air data probes at a frequency or band.

Example 6 includes the method of any of Examples 1-5, wherein determining the weighted average of air pressure for all air data probes comprises assigning weightings to faulty air data probes that are at least one of: (a) a fixed value lower than a fixed value assigned as a weighting to non-faulty air data probes, (b) a number of faulty air probes, and (c) a variable dependent upon an absolute value of the difference between the transmission loss and the first threshold value.

Example 7 includes the method of any of Examples 1-6, wherein determining the transmission loss for each air data probe comprises determining the transmission loss for each air data probe in a mass controlled region bandwidth.

Example 8 includes A non-transitory computer readable medium storing a program causing at least one processor to execute a process to determine efficient memory partitioning, the process comprising: receiving measured air pressure data from each air data probe on a vehicle; receiving a first set of data from at least one sensor system on the vehicle; determining predicted noise levels for each air data probe using a noise modelling system and the received first set of data; determining a transmission loss for each air data probe; determining if any air data probe is faulty by determining if an transmission loss of any of the air data probes is greater than a first threshold value, where an air data probe is deemed faulty if its transmission loss is greater than the first threshold value; and if the transmission loss of any of the air data probes is greater than the first threshold value, then performing at least one of: (a) generation of a signal to alert at least one vehicle system that at least one air data probe is faulty, (b) generation of a signal to alert a crew of the vehicle that at least one air data probe is faulty, and (c) determination of a weighted average air pressure for all air data probes, where the air pressures of any faulty air data probe has a lower weighting than air pressures of any non-faulty air data probes.

Example 9 includes the non-transitory computer readable medium of Example 8, where the determining the transmission loss for each air data probe comprises determining the transmission loss for each air data probe by at least one of: comparing noise level measurements, power spectral densities at given frequencies, and through fractional-octave analysis.

Example 10 includes the non-transitory computer readable medium of any of Examples 8-9, further comprising receiving a second set of data from the at least one sensor system on the vehicle; and generating at least one noise model using the received second set of data.

Example 11 includes the non-transitory computer readable medium of any of Examples 9-10, further comprising using the first set of data to modify the at least one noise model.

Example 12 includes the non-transitory computer readable medium of any of Examples 8-11, wherein determining whether any air data probe is faulty further comprises analyzing at least one of: a. the transmission loss for one or more air data probes at one or more frequencies and/or over one or more band(s); b. the difference in transmission loss of an air data probe at any two frequencies or over band(s); c. the difference in measured noise of an air data probe at any two frequencies or over bands; and d. the difference in measured noise of two or more air data probes at a frequency or band.

Example 13 includes the non-transitory computer readable medium of any of Examples 8-12, wherein determining the weighted average of air pressure for all air data probes comprises assigning weightings to faulty air data probes that are at least one of: (a) a fixed value lower than a fixed value assigned as a weighting to non-faulty air data probes, (b) a number of faulty air probes, and (c) a variable dependent upon an absolute value of the difference between the transmission loss and the first threshold value.

Example 14 includes the non-transitory computer readable medium of any of Examples 8-13, wherein determining the transmission loss for each air data probe comprises determining the transmission loss for each air data probe in a mass controlled region bandwidth.

Example 15 includes A vehicle, comprising: at least two air data probes; an air data monitoring system coupled to the at least two air data probes; at least one of a propulsion system and a directional control system; a sensor system coupled to the at least one of a propulsion system and a directional control system; at least one input/output device (I/O); and a state machine, comprising a noise modelling system, coupled to the air data monitoring system, the at least one sensor system, and the at least one I/O, is configured to: receive a first set of data measured by the sensor system; determine, with the noise modelling system, predicted noise levels for each of the at least two air data probes using the received first set of data; determine a transmission loss for each of the at least two air data probes; determine if any of the at least two air data probes are faulty by determining if an transmission loss of any of the at least two air data probes is greater than a first threshold value, where an air data probe is deemed faulty if its transmission loss is greater than the first threshold value; and if the transmission loss of any of the at least two air data probes is greater than the first threshold value, perform at least one of: (a) generation of a signal to alert at least one vehicle system that at least one air data probe is faulty, (b) generation a signal to alert, with the at least one I/O, vehicle crew or at least one vehicle system that at least one air data probe is faulty, and (c) determination of a weighted average air pressure for all air data probes, where the air pressures of any faulty air data probe has a lower weighting than air pressures of any non-faulty air data probes.

Example 16 includes the system of Example 15, wherein determine the transmission loss for each of the at least two air data probes comprises determining the transmission loss for each of the at least two air data probes by at least one of: comparing noise level measurements, power spectral densities at given frequencies, and through fractional-octave analysis Example 17 includes the system of any of Examples of 15-16, wherein the state machine is further configured to receive a second set of data from the sensor system; and generate at least one noise model using the received first set of data.

Example 18 includes the system of any of Examples 15-17, further comprising using the first set of data to modify the at least one noise model.

Example 19 includes the system of any of Examples 15-18, wherein determine the transmission loss for each of the at least two air data probes comprises wherein determining whether any air data probe is faulty further comprises analyzing at least one of: a. the transmission loss for one or more air data probes at one or more frequencies and/or over one or more band(s); b. the difference in transmission loss of an air data probe at any two frequencies or over band(s); c. the difference in measured noise of an air data probe at any two frequencies or over bands; and d. the difference in measured noise of two or more air data probes at a frequency or band.

Example 20 includes the system of any of Examples 15-19, wherein perform the determination of the weighted average of air pressure for all air data probes comprises assign weightings to faulty air data probes that are at least one of: (a) a fixed value lower than a fixed value assigned as a weighting to non-faulty air data probes, (b) a number of faulty air probes, and (c) a variable dependent upon an absolute value of the difference between the transmission loss and the first threshold value.

Example 21 includes the system of any of Examples 15-20, wherein determining the transmission loss for each air data probe comprises determining the transmission loss in a mass controlled region bandwidth.

It will be evident to one of ordinary skill in the art that the processes and resulting apparatus previously described can be modified to form various apparatuses having different circuit implementations and methods of operation. Notwithstanding that the numerical ranges and parameters setting forth the broad scope of the present teachings are approximations, the numerical values set forth in the specific examples are reported as precisely as possible.

While the present teachings have been illustrated with respect to one or more implementations, alterations and/or modifications can be made to the illustrated examples without departing from the scope of the appended claims. In addition, while a particular feature of the present disclosure may have been described with respect to only one of several implementations, such feature may be combined with one or more other features of the other implementations as may be desired and advantageous for any given or particular function. Furthermore, to the extent that the terms "including," "includes," "having," "has," "with," or variants thereof are used in either the detailed description and the claims, such terms are intended to be inclusive in a manner similar to the term "comprising." The term "at least one of" is used to mean one or more of the listed items can be selected. As used herein, the term "one or more of" with respect to a listing of items such as, for example, A and B or A and/or B, means A alone, B alone, or A and B. Further, in the discussion and claims herein, the term "on" used with respect to two materials, one "on" the other, means at least some contact between the materials, while "over" means the materials are in proximity, but possibly with one or more additional intervening materials such that contact is possible but not required. Neither "on" nor "over" implies any directionality as used herein. The term "conformal" describes a coating material in which angles of the underlying material are preserved by the conformal material.

The terms "about" or "substantially" indicate that the value or parameter specified may be somewhat altered, as long as the alteration does not result in nonconformance of the process or structure to the illustrated embodiment. Finally, "exemplary" indicates the description is used as an example, rather than implying that it is an ideal. Although specific embodiments have been illustrated and described herein, it will be appreciated by those of ordinary skill in the art that any arrangement, which is calculated to achieve the same purpose, may be substituted for the specific embodiments shown. Therefore, it is manifestly intended that this invention be limited only by the claims and the equivalents thereof.

What is claimed is:

1. A method, comprising:
    receiving measured air pressure data, including a measured noise level over frequency from each air data probe on a vehicle, wherein the measured noise level is generated by a vehicle's propulsion system;
    receiving a first set of data from at least one other sensor on the vehicle;
    determining a predicted noise level over frequency for each air data probe with a noise modelling system using the received first set of data, wherein the noise modelling system comprises a noise model based upon air data probe design, vehicle's propulsion system characteristics, and other sensor type;
    determining a difference between the predicted noise level and the measured noise level for each air data probe, wherein each air data probe is configured to measure total pressure or static pressure;
    determining if any air data probe is faulty by determining if the determined difference of any air data probe is greater than a first threshold value, wherein an air data probe is deemed faulty if its difference between the predicted noise level and the measured noise level is greater than the first threshold value; and
    if the determined difference between the predicted noise level and the measured noise level of any air data probe is greater than the first threshold value, then performing at least one of: (a) generation of a signal to alert at least one vehicle system that at least one air data probe is faulty, (b) generation of a signal to alert a crew of the vehicle that at least one air data probe is faulty, and (c) determination of a weighted average air pressure for all air data probes, wherein the measured air pressure data of any faulty air data probe has a lower weighting than air pressure data of any non-faulty air data probes.

2. The method of claim 1, wherein determining the difference for each air data probe comprises determining the difference for each air data probe by at least one of: comparing noise level measurements, power spectral densities at given frequencies, and through fractional-octave analysis.

3. The method of claim 1, further comprising receiving a second set of data from the at least one other sensor on the vehicle;
- wherein the first set of data and the second set of data each comprise at least one of environmental data and vehicle state vector data; and
- generating at least one noise model using the received second set of data.

4. The method of claim 3, further comprising using the first set of data to modify the at least one noise model.

5. The method of claim 1, wherein determining whether any air data probe is faulty further comprises analyzing at least one of:
- a. the difference between the predicted noise level and the measured noise level for one or more air data probes at one or more frequencies and/or over one or more band(s);
- b. a difference in the difference between the predicted noise level and the measured noise level of an air data probe at any two frequencies or over band(s);
- c. the difference in measured noise levels of an air data probe at any two frequencies or over bands; and
- d. the difference in measured noise levels of two or more air data probes at a frequency or band.

6. The method of claim 1, wherein determining the weighted average air pressure for all air data probes comprises assigning weightings to faulty air data probes that are at least one of: (a) a fixed value lower than a fixed value assigned as a weighting to non-faulty air data probes, (b) a number of faulty air probes, and (c) a variable dependent upon an absolute value of the difference between the difference between the predicted noise level and the measured noise level and the first threshold value.

7. The method of claim 1, wherein determining the difference for each air data probe comprises determining the difference for each air data probe in a mass controlled region bandwidth, wherein the mass controlled region bandwidth is a region where logarithmic difference between the predicted noise level and the measured noise level for an air data probe increases monotonically and linearly with logarithmic frequency.

8. A non-transitory computer readable medium storing a program causing at least one processor to execute a process, the process comprising:
- receiving measured air pressure data, including a measured noise level over frequency from each air data probe on a vehicle, wherein the measured noise level is generated by a vehicle's propulsion system;
- receiving a first set of data from at least one other sensor on the vehicle;
- determining a predicted noise level over frequency for each air data probe with a noise modelling system using the received first set of data, wherein the noise modelling system comprises a noise model based upon air data probe design, vehicle's propulsion system characteristics, and other sensor type;
- determining a difference between the predicted noise level and the measured noise level for each air data probe, wherein each air data probe is configured to measure total pressure or static pressure;
- determining if any air data probe is faulty by determining if the determined difference of any of the air data probe is greater than a first threshold value, wherein an air data probe is deemed faulty if difference between the predicted noise level and the measured noise level is greater than the first threshold value; and
- if the determined difference of any air data probe is greater than the first threshold value, then performing at least one of: (a) generation of a signal to alert at least one vehicle system that at least one air data probe is faulty, (b) generation of a signal to alert a crew of the vehicle that at least one air data probe is faulty, and (c) determination of a weighted average air pressure for all air data probes, wherein the measured air pressure data of any faulty air data probe has a lower weighting than air pressure data of any non-faulty air data probes.

9. The non-transitory computer readable medium of claim 8, wherein determining the difference for each air data probe comprises determining the difference for each air data probe by at least one of: comparing noise level measurements, power spectral densities at given frequencies, and through fractional-octave analysis.

10. The non-transitory computer readable medium of claim 8, the process further comprising receiving a second set of data from the at least one other sensor on the vehicle; and
- generating at least one noise model using the received second set of data.

11. The non-transitory computer readable medium of claim 10, the process further comprising using the first set of data to modify the at least one noise model.

12. The non-transitory computer readable medium of claim 8, wherein determining whether any air data probe is faulty further comprises analyzing at least one of:
- a. the difference between the predicted noise level and the measured noise level for one or more air data probes at one or more frequencies and/or over one or more band(s);
- b. a difference in the difference between the predicted noise level and the measured noise level of an air data probe at any two frequencies or over band(s);
- c. the difference in measured noise levels of an air data probe at any two frequencies or over bands; and
- d. the difference in measured noise levels of two or more air data probes at a frequency or band.

13. The non-transitory computer readable medium of claim 8, wherein determining the weighted average air pressure for all air data probes comprises assigning weightings to faulty air data probes that are at least one of: (a) a fixed value lower than a fixed value assigned as a weighting to non-faulty air data probes, (b) a number of faulty air probes, and (c) a variable dependent upon an absolute value of the difference between the difference between the predicted noise level and the measured noise level and the first threshold value.

14. The non-transitory computer readable medium of claim 8, wherein determining the difference for each air data probe comprises determining the difference for each air data probe in a mass controlled region bandwidth, wherein the mass controlled region bandwidth is a region where logarithmic difference between the predicted noise level and the measured noise level for an air data probe increases monotonically and linearly with logarithmic frequency.

15. A system, comprising:
- at least two air data probes of a vehicle;
- an air data monitoring system, of the vehicle, coupled to the at least two air data probes;
- at least one of a propulsion system of the vehicle and a directional control system;

at least one other sensor, of the vehicle, coupled to the at least one of a propulsion system and a directional control system;

at least one input/output device (I/O); and a state machine of the vehicle, comprising a noise modelling system, coupled to the air data monitoring system, the at least one other sensor, and the at least one I/O, is configured to:

receive measured air pressure data, including a measured noise level over frequency, measured by each air data probe, wherein the measured noise level is generated by a vehicle's propulsion system;

receive a first set of data measured by the at least one other sensor on the vehicle;

determine, with the noise modelling system, a predicted noise level over frequency for each of the at least two air data probes with a noise modelling system using the received first set of data, wherein the noise modelling system comprises a noise model based upon air data probe design, vehicle's propulsion system characteristics, and other sensor type;

determine a difference between the predicted noise level and the measured noise level for each of the at least two air data probes, wherein each air data probe is configured to measure total pressure or static pressure;

determine if any of the at least two air data probes are faulty by determining if the determined difference of any of the at least two air data probes is greater than a first threshold value, wherein an air data probe is deemed faulty if its difference between the predicted noise level and the measured noise level is greater than the first threshold value; and if the difference between the predicted noise level and the measured noise level of any of the at least two air data probes is greater than the first threshold value, perform at least one of: (a) generation of a signal to alert at least one vehicle system that at least one air data probe is faulty, (b) generation a signal to alert, with the at least one I/O, vehicle crew or at least one vehicle system that at least one air data probe is faulty, and (c) determination of a weighted average air pressure for all air data probes, wherein the measured air pressure data of any faulty air data probe has a lower weighting than air pressure data of any non-faulty air data probes.

16. The system of claim 15, wherein determine the difference for each of the at least two air data probes comprises determining the difference for each of the at least two air data probes by at least one of: comparing noise level measurements, power spectral densities at given frequencies, and through fractional-octave analysis.

17. The system of claim 15, wherein the state machine is further configured to receive a second set of data from the at least one other sensor;

wherein the first set of data and the second set of data each comprise at least one of environmental data and vehicle state vector data; and generate at least one noise model using the received first set of data.

18. The system of claim 17, wherein the state machine is further configured to use the first set of data to modify the at least one noise model.

19. The system of claim 15, wherein determine the difference between the predicted noise level and the measured noise level for each of the at least two air data probes comprises wherein determining whether any air data probe is faulty further comprises analyzing at least one of:

a. the difference between the predicted noise level and the measured noise level for one or more air data probes at one or more frequencies and/or over one or more band(s);

b. a difference in the difference between the predicted noise level and the measured noise level of an air data probe at any two frequencies or over band(s);

c. the difference in measured noise levels of an air data probe at any two frequencies or over bands; and d. the difference in measured noise levels of two or more air data probes at a frequency or band.

20. The system of claim 15, wherein perform the determination of the weighted average air pressure for all air data probes comprises assign weightings to faulty air data probes that are at least one of: (a) a fixed value lower than a fixed value assigned as a weighting to non-faulty air data probes, (b) a number of faulty air probes, and (c) a variable dependent upon an absolute value of the difference between the difference between the predicted noise level and the measured noise level and the first threshold value.

21. The system of claim 15, wherein determining the difference for each air data probe comprises determining the difference in a mass controlled region bandwidth, wherein the mass controlled region bandwidth is a region where logarithmic difference between the predicted noise level and the measured noise level for an air data probe increases monotonically and linearly with logarithmic frequency.

\* \* \* \* \*